(12) United States Patent
Fontius

(10) Patent No.: US 9,121,908 B2
(45) Date of Patent: Sep. 1, 2015

(54) MAGNETIC RESONANCE SYSTEM AND A METHOD FOR EMITTING HIGH-FREQUENCY SIGNALS

(75) Inventor: Jörg Ulrich Fontius, Neunkirchen A. Brand (DE)

(73) Assignee: Siemens Aktiengesellschaft, München (DE)

(*) Notice: Subject to any disclaimer, the term of this patent is extended or adjusted under 35 U.S.C. 154(b) by 999 days.

(21) Appl. No.: 13/269,052

(22) Filed: Oct. 7, 2011

(65) Prior Publication Data

US 2012/0262168 A1 Oct. 18, 2012

(30) Foreign Application Priority Data

Oct. 8, 2010 (DE) .................. 10 2010 042 219

(51) Int. Cl.
*G01V 3/00* (2006.01)
*G01R 33/36* (2006.01)
*G01R 33/3415* (2006.01)
*G01R 33/561* (2006.01)

(52) U.S. Cl.
CPC ............ *G01R 33/36* (2013.01); *G01R 33/3664* (2013.01); *G01R 33/3415* (2013.01); *G01R 33/5612* (2013.01)

(58) Field of Classification Search
CPC .................................................. G01R 33/3664
USPC .................................. 324/322, 318, 314, 300
See application file for complete search history.

(56) References Cited

U.S. PATENT DOCUMENTS 5,945,826 A 8/1999 Leussler
7,439,742 B2* 10/2008 Fontius et al. ............... 324/318
7,701,213 B2* 4/2010 Graesslin et al. ............ 324/318
8,402,300 B2* 3/2013 Baumgartl et al. .......... 713/400
2004/0155656 A1 8/2004 Leussler
2005/0140369 A1 6/2005 Feiweier et al.
2005/0225326 A1 10/2005 He et al.
2009/0079428 A1 3/2009 Nistler et al.
2009/0146660 A1 6/2009 Schnell et al.
2011/0050224 A1 3/2011 Baumgartl et al.

FOREIGN PATENT DOCUMENTS

| CN | 1676095 A | 10/2005 |
|---|---|---|
| CN | 101398471 A | 4/2009 |
| CN | 101458313 A | 6/2009 |
| DE | 102005036513 A1 | 8/2006 |
| DE | 10 2009 038 784 A1 | 3/2011 |
| JP | H1085199 A | 4/1998 |

OTHER PUBLICATIONS

Chinese Office Action dated Sep. 2, 2014 for corresponding Chinese Patent Application No. 201110294370.7 with English translation.
German Office Action dated Jun. 28, 2011 for corresponding German Patent Application No. DE 10 2010 042 219.3 with English translation.

* cited by examiner

*Primary Examiner* — Louis Arana
(74) *Attorney, Agent, or Firm* — Lempia Summerfield Katz LLC

(57) ABSTRACT

A magnetic resonance system having a transmitting system with a high-frequency antenna unit and a high-frequency transmit array. The high-frequency antenna unit is configured to emit high-frequency signals and receive magnetic resonance signals. The high-frequency transmit array has two high-frequency transmit units that allow parallel transmission of high-frequency signals. Each of the high-frequency transmit units of the high-frequency transmit array includes a separate trigger unit.

21 Claims, 4 Drawing Sheets

MAGNETIC RESONANCE SYSTEM AND A METHOD FOR EMITTING HIGH-FREQUENCY SIGNALS

This application claims the benefit of DE 10 2010 042 219.3, filed Oct. 8, 2010.

BACKGROUND

The present embodiments relate to a magnetic resonance system.

Known magnetic resonance systems have transmitting systems that feature a plurality of transmit channels or a plurality of transmit units for the purpose of generating or emitting high-frequency signals or high-frequency pulses. These high-frequency signals or high-frequency pulses may be emitted independently of one another. These high-frequency signals or high-frequency pulses may be emitted simultaneously but have different high-frequency pulse shapes, if the transmitting system has, for example, a high-frequency transmit array such as the one disclosed in U.S. Pat. No. 7,439,742.

It is also known that trigger signals for magnetic resonance measurements may be provided by, for example, an EKG measurement or a respiratory measurement. In known examples, triggering occurs via a single-channel system. Accordingly, only one of the transmit units of the transmitting system is configured to receive an input of a trigger signal. The transmit unit then generates a single signal. The signal is split according to a number of further transmit channels or transmit units of the transmitting system, and a split partial signal is distributed to these further transmit units such that an identical input signal is present at all transmit units. This type of triggering is, however, disadvantageous because it is not possible to independently adjust a transmit signal at a transmit unit, relative to other transmit signals at other transmit units, based on an incoming trigger signal.

SUMMARY AND DESCRIPTION

The present embodiments may obviate one or more of the drawbacks or limitations in the related art. For example, a magnetic resonance system in which real-time applications may be achieved independently of one another for all transmit units of a transmitting system may be provided.

In the present embodiments, a magnetic resonance system includes a transmitting system. The transmitting system includes a high-frequency antenna unit that emits high-frequency signals and receives magnetic resonance signals. The transmitting system further includes a high-frequency transmit array with at least two high-frequency transmit units that allow parallel transmission of high-frequency signals.

In one embodiment, each of the high-frequency transmit units of the high-frequency transmit array have a separate trigger unit to allow the individual high-frequency transmit units to receive trigger signals independently of one another. In turn, applications may, advantageously, be executed under real-time conditions. Likewise, one of the individual high-frequency transmit units may react under real-time conditions to the respective trigger signal of one of the trigger units, such as by adapting a high-frequency pulse shape. The trigger units allow, for example, trigger signals to be captured independently of one another for each high-frequency transmit unit using an EKG measurement, a respiratory measurement, or a movement correction. The trigger units also allow a measuring routine of a subsequent magnetic resonance measurement to be controlled depending on the trigger signals.

As discussed herein, parallel transmission of high-frequency signals is understood to refer to a concurrent and/or synchronous transmission of high-frequency signals using or via at least two high-frequency transmit units. In one embodiment, the high-frequency signals are high-frequency pulses, and the high-frequency transmit array is a transmit array (TX-array). Each of the separate trigger units have, for example, a TTL (transistor-transistor logic) trigger interface and/or further trigger interfaces suitable to a person skilled in the art. In one embodiment, the high-frequency antenna unit may include a plurality of high-frequency antennas that may be independently activated by the high-frequency transmit array.

In one embodiment, each of the trigger units have at least two different trigger ports. This allows different trigger signals to be received at each of the high-frequency transmit units. A first of the at least two trigger ports for each trigger unit is configured to receive an input of a synchronous trigger signal. A second of the at least two trigger ports for each trigger unit is configured to receive an input of an asynchronous trigger signal. As discussed herein, synchronicity or asynchronicity of the trigger signals refers to the timing of an arrival of the trigger signal at one of the trigger units relative to an arrival of one of the other trigger signals at one of the other trigger units.

In one embodiment, each trigger unit includes a selection module for the purpose of selecting between the two different trigger ports of the trigger unit depending on a trigger situation. This allows, for example, automatic selection between the trigger ports. In such a case, only one of the two trigger ports for each trigger unit is occupied with an input signal. The selection module recognizes or determines which of the two trigger ports is currently being used. Furthermore, the selection module may also make a selection between the two trigger ports on the basis of a specified measuring routine and/or trigger routine. In one embodiment, the selection module has a software module stored in a storage unit of the relevant trigger unit and/or high-frequency transmit unit. The software module selects and/or decides which of the two trigger ports is to be used as a trigger for generating and/or emitting the high-frequency signal.

In one embodiment, at least one of the high-frequency transmit units is a slave unit and at least one high-frequency transmit unit is a master unit. Accordingly, a transmitting system having a multiplicity of high-frequency transmit units may be constructed. Likewise, further high-frequency transmit units (e.g., slave units) may be added to the existing transmitting system. As discussed herein, a master-slave arrangement is understood to refer to an arrangement used to organize and distribute tasks between superordinate units (e.g., the master unit) and subordinate units (e.g., the slave unit). In this embodiment, the master unit and the slave units may each at least partially take the form of an arithmetic-logic unit. Such master-slave arrangements are used when, for example, one arithmetic-logic unit assumes control over and/or task distribution for other arithmetic-logic units.

In one embodiment, the master unit includes at least one signal generator unit that generates a separate trigger signal for each of at least two high-frequency transmit units. Advantageously, this allows the individual high-frequency transmit units to be isolated while only a single trigger source is used. The individual trigger signals of the different trigger units or of the different high-frequency transmit units are generated independently of each other. The trigger signal arriving at the further high-frequency transmit unit takes the form of an internal trigger signal.

In one embodiment, the master unit includes a synchronizing unit that generates a shared working clock pulse to synchronize the individual trigger signals. The individual trigger signals may, therefore, arrive synchronously at the individual high-frequency transmit units, thus avoiding an undesired time delay between the individual trigger signals. Moreover, the trigger signals may be timed to be synchronized relative to a working clock pulse of the transmitting system or of the high-frequency transmit array. Advantageously, the master unit is thus designed to transmit a synchronized trigger signal to the individual high-frequency transmit units.

A method for parallel emission of at least partially different high-frequency signals for a magnetic resonance system may also be provided. In the present embodiments, the high-frequency signals are emitted by high-frequency transmit units of a transmitting system.

In one embodiment, at least one independent trigger signal should be captured by each of the high-frequency transmit units. As a result, applications may be executed under real-time conditions and/or react under real-time conditions, by for example adapting a high-frequency pulse shape, to the respective trigger signal of one of the trigger units within the individual high-frequency transmit units. The trigger units allow, for example, trigger signals to be captured independently of each other using an EKG measurement, a respiratory measurement, and/or a movement correction, for each high-frequency transmit unit. The trigger units also allow a measuring routine of a subsequent magnetic resonance measurement to be controlled depending on the trigger signals. In one embodiment, the individual trigger signals arriving at the trigger units may be external trigger signals or, in other words, trigger signals from different external trigger sources. Alternatively, the individual trigger signals arriving at the trigger units may be internal trigger signals generated independently of one another within the high-frequency transmit array. As discussed herein, an independent trigger signal is understood to refer to a trigger signal generated and/or produced, independently of other trigger signals, for the further high-frequency transmit units of the high-frequency transmit array.

In one embodiment, at least two trigger signals are generated independently of one another by a master unit for at least two high-frequency transmit units. This allows the individual high-frequency transmit units and, more particularly, a trigger signal arriving at the high-frequency transmit units, to be isolated while using only a single trigger source.

In one embodiment, at least two trigger signals are synchronized, relative to a working clock pulse, when they arrive at the relevant high-frequency transmit units. In this context, synchronization is understood to refer to two trigger signals arriving at the high-frequency transmit units at a defined time point relative to the working clock pulse and completely within a working clock pulse, such that the individual trigger units receive the respective trigger signals concurrently. It is thus possible to prevent undesired delays of the individual trigger signals relative to each other. Therefore, high-frequency signals for magnetic resonance measurements may be generated or emitted to all high-frequency transmit units concurrently and under real-time conditions.

DETAILED DESCRIPTION OF THE DRAWINGS

Figure 1:
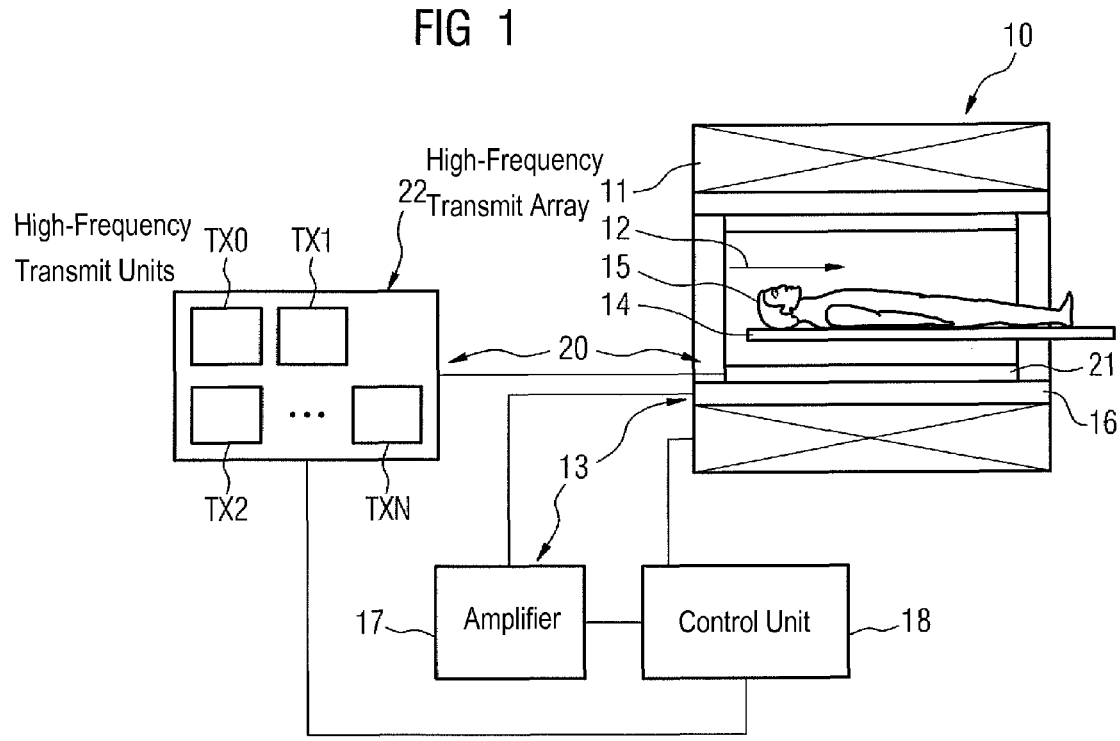
FIG. 1 shows one embodiment of a magnetic resonance system having a transmitting system.

FIG. 1 shows a magnetic resonance system 10. The magnetic resonance system 10 includes a main magnet 11 for generating a strong and, in this embodiment, constant main magnetic field 12. In addition, the magnetic resonance system 10 includes a holding region 14 for holding a patient 15. The holding region 14 is circumferentially surrounded by the main magnet 10. Furthermore, the magnetic resonance system 10 includes a gradient unit 13 for generating linear gradient fields provided for the spatial encoding of individual subregions of an examination region. The examination region is arranged within the holding region 14. The gradient unit 13 has gradient coils 16 and a gradient amplifier 17. The magnetic resonance system 10 also has a control unit 18 that centrally controls the magnetic resonance system 10 by, for example, automatically executing a selected imaging gradient echo-sequence.

The magnetic resonance system 10 additionally features a transmitting system 20. The transmitting system includes a high-frequency antenna unit 21 and a high-frequency transmit array 22. High-frequency signals are emitted by or via the high-frequency antenna unit 21 during operation of the magnetic resonance system 10 for the purpose of stimulating a polarization established in the main magnetic field 12 generated by the main magnet 11. Magnetic resonance signals are received by or via the high-frequency antenna unit 21. The high-frequency transmit array 22 has a multiplicity of high-frequency transmit units TX0, TX1, TX2 ... TXN that allow parallel transmission of at least partially differing high-frequency signals and/or high-frequency pulses. The individual high-frequency signals may differ by virtue of a high-frequency pulse shape and/or other signal parameters. The high-frequency signals are generated within the high-frequency transmit units TX0, TX1, TX2 ... TXN and are transmitted from the respective transmit unit to the high-frequency antenna unit 21.

Figure 2:
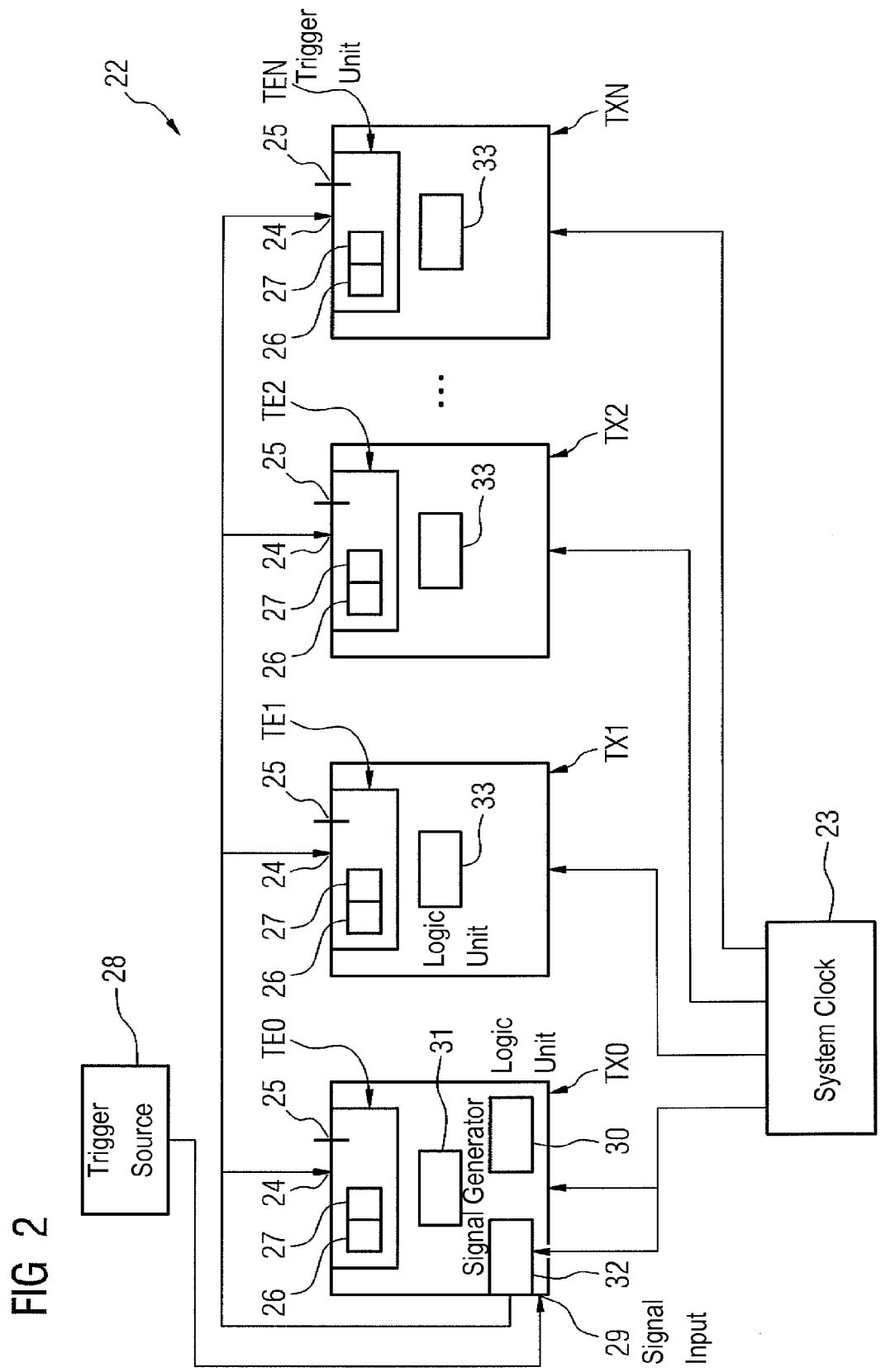
FIG. 2 shows the transmitting system in conjunction with an external trigger source according to one embodiment.
Figure 3:
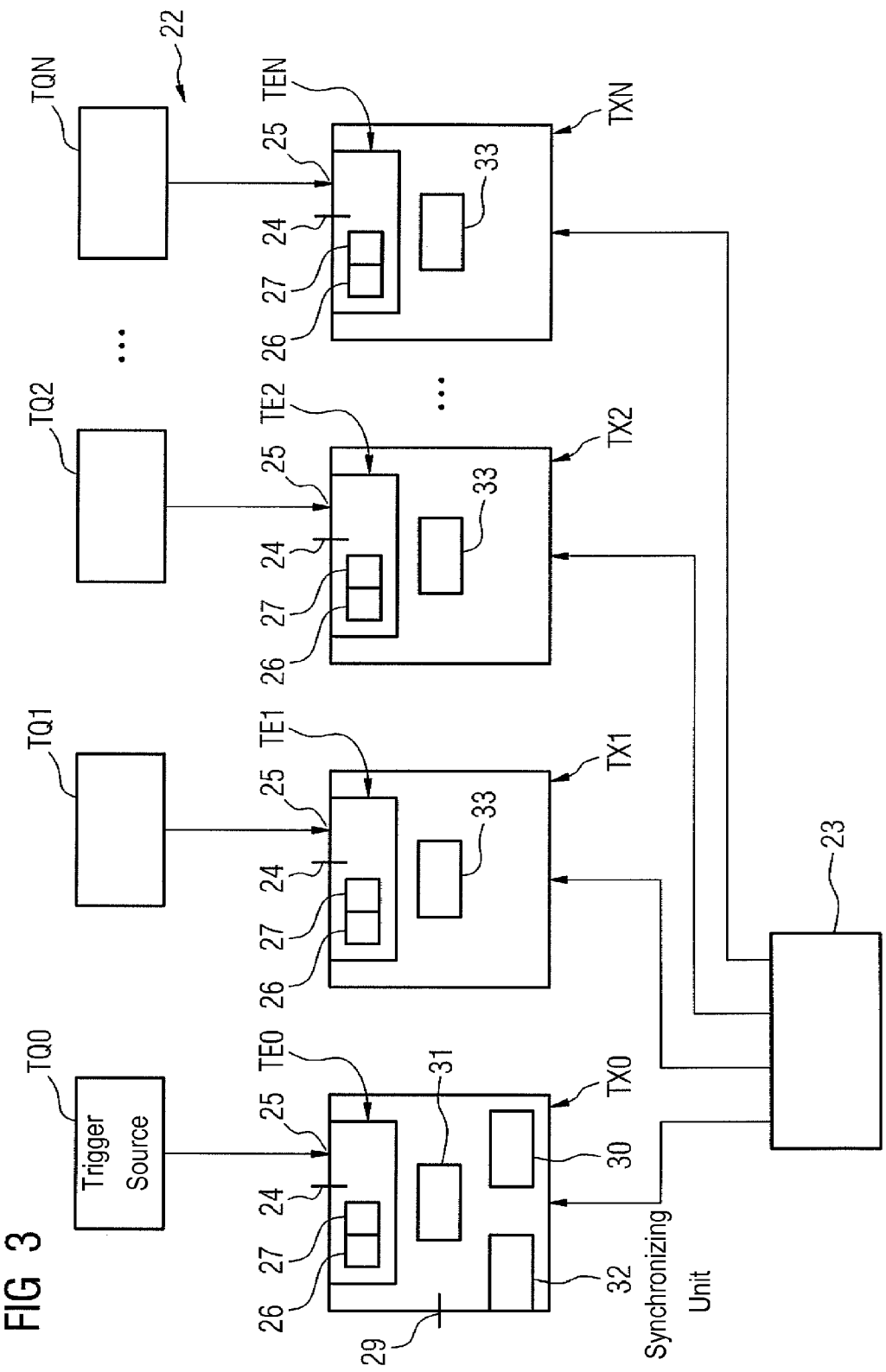
FIG. 3 shows the transmitting system in conjunction with a plurality of external trigger sources according to another embodiment.
Figure 4:
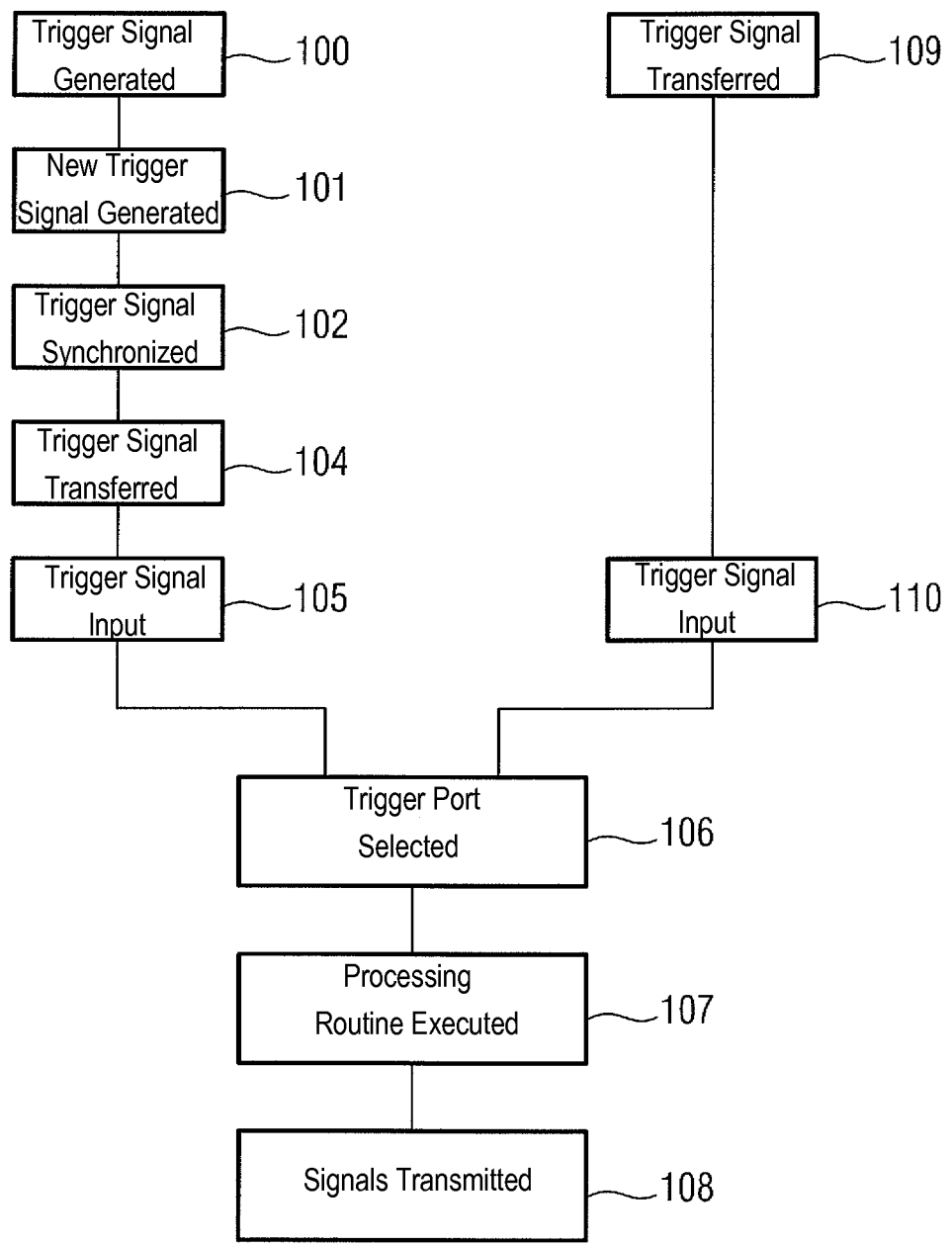
FIG. 4 shows an embodiment of a method for emitting high-frequency signals.

As shown in FIGS. 2 and 3, the high-frequency transmit array 22 is a transmit array (TX-array). In this embodiment, the high-frequency transmit array 22 forms a master-slave arrangement in which a first high-frequency transmit unit TX0 is a master unit and the further high-frequency transmit units TX1, TX2 ... TXN are each a slave unit. The slave units are formed by subordinate high-frequency transmit units TX1, TX2 ... TXN and the master unit is formed by a superordinate high-frequency transmit unit TX0, such that the master unit is at least partially responsible for the control or task distribution of the slave units.

The transmitting system 20 further includes a system clock 23 that provides a system clock pulse for the individual high-frequency transmit units TX0, TX1, TX2 ... TXN of the high-frequency transmit array 22. The system clock pulse of the system clock 23 is transferred to the individual high-frequency transmit units TX0, TX1, TX2 ... TXN via a data connection (not shown in greater detail). The data connection may be a data line or any other suitable connection.

Each of the high-frequency transmit units TX0, TX1, TX2 ... TXN of the high-frequency transmit array 22 features a separate trigger unit TE0, TE1, TE2 ... TEN. Each trigger unit TE0, TE1, TE2 ... TEN has two different trigger ports 24, 25. Via the two trigger ports 24, 25, each individual high-frequency transmit unit TX0, TX1, TX2 . . . TXN is able to directly receive trigger signals independently of the other high-frequency transmit units TX0, TX1, TX2 . . . TXN. The two trigger ports 24, 25 each have a TTL (transistor-transistor-logic) interface. Alternatively, the trigger ports may have further or different interfaces than disclosed herein.

Furthermore, each individual trigger unit TE0, TE1, TE2 . . . TEN includes an arithmetic-logic unit 26 or control unit configured or provided for selecting between the two different trigger ports 24, 25, depending on a trigger situation. For this purpose, each of the arithmetic-logic units 26 or control units has a selection module 27 stored in a storage unit (not shown) included in the arithmetic-logic unit 26. Each selection module 27 includes a software module that performs the selection.

As shown in FIG. 2, an external trigger signal is generated by a single external trigger source 28 and arrives at the master unit (act 100). The master unit includes a signal input 29 to receive the external trigger signal. The incoming external trigger signal is first evaluated by an arithmetic-logic unit 30 in the master unit. The external trigger signal is then processed by the master unit. A signal generator unit 31 in the master unit generates a new internal trigger signal from the incoming external trigger signal for each of the high-frequency transmit units TX0, TX1, TX2 . . . TXN (generation act 101). Each of the individual internal trigger signals generated by the signal generator unit 31 are independent from the other internal trigger signals generated by the signal generator unit 31. Within the signal generator unit 31, a separate internal trigger signal is therefore generated for each of the high-frequency transmit units TX0, TX1, TX2 . . . TXN. The signal generator unit 31 is controlled by the arithmetic-logic unit 30 of the master unit. Though not shown in greater detail, the master unit also includes a second signal generator unit that generates a working clock pulse from the system clock pulse. This working clock pulse is transferred to the slave units by or via a signal line. Instructions are executed in signal processors of the master unit and slave units using the shared working clock pulse.

Furthermore, the master unit includes a synchronizing unit 32 that synchronizes the individual internal trigger signals generated by the signal generator unit 31 for the individual high-frequency transmit units TX0, TX1, TX2 . . . TXN (synchronization act 102). The individual internal trigger signals are synchronized to the working clock pulse of the high-frequency transmit array 22 in such a way that all internal trigger signals for the individual high-frequency transmit units TX0, TX1, TX2 . . . TXN arrive at the individual high-frequency transmit units TX0, TX1, TX2 . . . TXN at a defined time point relative to the working clock pulse. The synchronizing unit 32 is also controlled by the arithmetic-logic unit 30 of the master unit. In transfer act 104, these internal trigger signals are transferred to each of the high-frequency transmit units TX0, TX1, TX2 . . . TXN. For this purpose, the individual high-frequency transmit units TX0, TX1, TX2 . . . TXN are connected to the master unit via a data connection such as a data line and/or any other suitable data connection.

In input act 105, the individual internal trigger signals arrive at the individual trigger units TE0, TE1, TE2 . . . TEN of the high-frequency transmit units TX0, TX1, TX2 . . . TXN. In the depicted embodiment, the individual internal trigger signals arrive at a first of the two trigger ports 24. In selection act 106, the selection module 27 may be used to select the corresponding trigger port 24. The selected corresponding trigger port 24 is activated by the selection, such that signals arriving at the trigger port 24 may be used to trigger a measurement. At the same time that the trigger port 24 is selected, the selection module 27 may be used to select and start a signal processing routine. The signal processing routine is stored within a further arithmetic-logic unit 30, 33 of each of the respective high-frequency transmit units TX0, TX1, TX2 . . . TX0. The arithmetic-logic units 30, 33 have a plurality of signal processing routines that differ with respect to signal processing according to the signal input at the different trigger ports 24, 25. Depending on which of the trigger ports 24, 25 is selected, different processing routines for further processing of the incoming trigger signal are then executed in a processing act 107 in the individual high-frequency transmit units TX0, TX1, TX2 . . . TXN or in the individual arithmetic-logic units 30, 33. Specific work instructions and/or functions, which are part of the signal processing routines, are assigned to the trigger signals in the arithmetic-logic units 30, 33 using the signal selection module 27. These instructions are then executed synchronously with the next working clock pulse. In other embodiments, the assigned function may be the start of a measurement, the continuation of a measurement that has been stopped, the selection of specific high-frequency pulses, or the selection of a specific measurement routine.

Trigger signals may likewise arrive at the second trigger port 25 of the trigger units TE0, TE1, TE2 . . . TEN, as shown in greater detail in FIG. 3. The two trigger ports 24, of the individual trigger units TE0, TE1, TE2 . . . TEN differ only in that synchronous trigger signals, particularly trigger signals formed synchronously relative to incoming trigger signals of the further trigger units TE0, TE1, TE2 . . . TEN and have the same clock cycle as the working clock pulse, arrive at the first trigger port 24, while trigger signals that are independent of a trigger signal input of a further trigger signal of a further trigger unit TE0, TE1, TE2 . . . TEN arrive at the second trigger port 25. In the depicted embodiment, the trigger signals arriving at the second trigger ports 25 of the individual trigger units TE0, TE1, TE2 . . . TEN may originate from or be generated by different trigger sources TQ0, TQ1, TQ2 . . . TQN. Each of the high-frequency transmit units TX0, TX1, TX2 . . . TXN or each of the trigger units TE0, TE1, TE2 . . . TEN is assigned to a separate external trigger source TQ0, TQ1, TQ2 . . . TQN, as shown in FIG. 3. In an alternative embodiment, it is conceivable for an external trigger source TQ0, TQ1, TQ2 . . . TQN to be assigned two or more high-frequency transmit units TX0, TX1, TX2 . . . TXN.

In a act 109, the external trigger signals generated by the individual trigger sources TQ0, TQ1, TQ2 . . . TQN are transferred to the individual high-frequency transmit units TX0, TX1, TX2 . . . TXN. In the subsequent input act 110, these trigger signals from the different trigger sources TQ0, TQ1, TQ2 . . . TQN arrive at the corresponding trigger units TE0, TE1, TE2 . . . TEN of the different high-frequency transmit units TX0, TX1, TX2 . . . TXN. The individual external trigger signals may be asynchronous relative to one another, the system clock pulse, and the working clock pulse of the high-frequency transmit array 22 Accordingly, the individual external trigger signals may arrive independently of one another and at different time points at the individual high-frequency transmit units TX0, TX1, TX2 . . . TXN or trigger units TE0, TE1, TE2 . . . TEN.

In addition to the external trigger signal, each of the individual high-frequency transmit units TX1, TX2 . . . TXN, which are, in this embodiment, slave units, also receives the working clock pulse from the master unit, such that individual high-frequency signals or high-frequency pulses of the individual high-frequency transmit units TX0, TX1, TX2 . . . TXN are emitted when a relevant trigger signal is present.

Following the arrival of the external trigger signals at the trigger units TE0, TE1, TE2 ... TEN or the arrival of the external trigger signals at the trigger port 25 (the signals arrive in a manner similar to how the signals arrive at the trigger port 24 of the trigger units TE0, TE1, TE2 ... TEN), the selection act 106 is initially performed using the selection module 27, as described above. However, unlike when the internal trigger signals arrive at the first trigger port 24, when the external trigger signals arrive at the second trigger port 25, the external trigger signals are not yet preprocessed. Depending on which of the trigger ports 24, 25 is selected, signal processing routines (not shown in greater detail herein) are selected from the incoming signals by the selection module 27 for the purpose of further processing the incoming trigger signals and, more particularly, generating a high-frequency signal depending on the incoming external trigger signal. In this embodiment, the signal processing routines may differ from the signal processing routines that are invoked when the selection module 27 registers and selects a trigger signal input at the first trigger port 24.

In FIGS. 2 and 3, the selection act 106 is followed by a processing act 107. In processing act 107, the individual external or internal trigger signals are further processed. Depending on the external or internal trigger signals that arrive at the trigger units TE0, TE1, TE2 ... TEN, high-frequency signals or high-frequency pulses are generated, in real time, in the individual arithmetic-logic units 30, 33 of the high-frequency transmit units TX0, TX1, TX2 ... TXN. In transmit act 108, the high-frequency signals or high-frequency pulses are transmitted to the high-frequency antenna unit 21. In this way, a measuring routine for a magnetic resonance measurement, particularly the individual high-frequency signals or high-frequency pulses generated in the individual high-frequency transmit units TX0, TX1, TX2 ... TXN, is controlled, in real time, by the independent trigger signals arriving at the trigger units TE0, TE1, TE2 ... TEN.

Moreover, the individual high-frequency signals or high-frequency pulses are synchronously transmitted to the high-frequency antenna unit by virtue of the shared internal trigger signal generated by master unit or in conjunction with the working clock pulse. The individual high-frequency signals or high-frequency pulses of the different high-frequency transmit units TX0, TX1, TX2 ... TXN may have different signal parameters. For example, the individual high-frequency signals may have a different pulse shape.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance system comprising:
a transmitting system having a high-frequency antenna unit and a high-frequency transmit array, the high-frequency antenna unit configured to emit high-frequency signals and receive magnetic resonance signals, and the high-frequency transmit array having at least two high-frequency transmit units that allow parallel transmission of high-frequency signals,
wherein each of the high-frequency transmit units of the high-frequency transmit array has a separate trigger unit operable to receive a respective trigger signal, and
wherein each of the separate trigger units has at least two different trigger ports.

2. The magnetic resonance device as claimed in claim 1, wherein each of the separate trigger units has a selection module to select between the two different trigger ports of the trigger unit depending on a trigger situation.

3. The magnetic resonance device as claimed in claim 2, wherein one of the at least two high-frequency transmit units is a slave unit.

4. The magnetic resonance device as claimed in claim 3, wherein one of the at least two high-frequency transmit units is a master unit.

5. The magnetic resonance system as claimed in claim 4, wherein the master unit is configured to transmit a synchronized trigger signal to each of the high-frequency transmit units.

6. The magnetic resonance device as claimed in claim 4, wherein the master unit has a signal generator unit configured to generate a separate trigger signal for each of the at least two high-frequency transmit units.

7. The magnetic resonance device as claimed in claim 6, wherein the master unit has a synchronizing unit configured to generate a shared working clock pulse for synchronization of the separate trigger signals.

8. The magnetic resonance device as claimed in claim 2, wherein one of the at least two high-frequency transmit units is a master unit.

9. The magnetic resonance device as claimed in claim 8, wherein the master unit has a signal generator unit configured to generate a separate trigger signal for each of the at least two high-frequency transmit units.

10. The magnetic resonance device as claimed in claim 9, wherein the master unit has a synchronizing unit configured to generate a shared working clock pulse for synchronization of the separate trigger signals.

11. The magnetic resonance system as claimed in claim 8, wherein the master unit is configured to transmit a synchronized trigger signal to each of the high-frequency transmit units.

12. The magnetic resonance device as claimed in claim 1, wherein one of the at least two high-frequency transmit units is a slave unit.

13. The magnetic resonance device as claimed in claim 1, wherein one of the at least two high-frequency transmit units is a master unit.

14. The magnetic resonance device as claimed in claim 13, wherein the master unit has a signal generator unit configured to generate a separate trigger signal for each of the at least two high-frequency transmit units.

15. The magnetic resonance device as claimed in claim 14, wherein the master unit has a synchronizing unit configured to generate a shared working clock pulse for synchronization of the separate trigger signals.

16. The magnetic resonance system as claimed in claim 13, wherein the master unit is configured to transmit a synchronized trigger signal to each of the high-frequency transmit units.

17. A method for parallel emission of at least partially different high-frequency signals for a magnetic resonance system having a transmitting system with a high-frequency antenna unit and a high-frequency transmit array, the method comprising:
emitting high-frequency signals from high-frequency transmit units of the high-frequency transmit array; and
capturing an independent trigger signal at each of the high-frequency transmit units, the high-frequency signals being generateable based on the independent trigger signals, each of the high-frequency transmit units of the high-frequency transmit array comprising a separate trigger unit, and each of the separate trigger units comprising at least two different trigger ports.

18. The method as claimed in claim 17, further comprising generating two independent trigger signals, via a master unit, for two high-frequency transmit units.

19. The method as claimed in claim 18, further comprising synchronizing, relative to a working clock pulse, the arrival of two independent trigger signals at the respective high-frequency transmit units.

20. The method as claimed in claim 17, further comprising synchronizing, relative to a working clock pulse, the arrival of two independent trigger signals at the respective high-frequency transmit units.

21. The method as claimed in claim 17, further comprising selecting between the at least two different trigger ports of each separate trigger unit depending on a trigger situation.

\* \* \* \* \*